United States Patent
Gerhard et al.

(10) Patent No.: US 7,880,379 B2
(45) Date of Patent: Feb. 1, 2011

(54) PHOSPHORESCENT ORGANIC ELECTROLUMINESCENT DEVICE HAVING NO HOLE TRANSPORTING LAYER

(75) Inventors: Anja Gerhard, Veitschöchheim (DE); Horst Vestweber, Gilserberg (DE); Philipp Stössel, Frankfurt (DE)

(73) Assignee: Merck Patent GmbH, Darmstadt (DE)

( * ) Notice: Subject to any disclaimer, the term of this patent is extended or adjusted under 35 U.S.C. 154(b) by 484 days.

(21) Appl. No.: 10/579,947

(22) PCT Filed: Nov. 24, 2004

(86) PCT No.: PCT/EP2004/013315

§ 371 (c)(1), (2), (4) Date: May 22, 2006

(87) PCT Pub. No.: WO2005/053051

PCT Pub. Date: Jun. 9, 2005

(65) Prior Publication Data

US 2007/0114915 A1     May 24, 2007

(30) Foreign Application Priority Data

Nov. 25, 2003 (DE) ................... 103 55 381
Feb. 10, 2004 (DE) ................. 10 2004 006 622
Apr. 1, 2004 (DE) ................... 10 2004 015 933

(51) Int. Cl.
*H01J 1/62* (2006.01)
*H01J 63/04* (2006.01)

(52) U.S. Cl. ............... 313/506; 313/483; 313/503; 313/504; 313/505

(58) Field of Classification Search ............ None
See application file for complete search history.

(56) References Cited

U.S. PATENT DOCUMENTS

| 4,539,507 | A | 9/1985 | VanSlyke et al. |
| 5,151,629 | A | 9/1992 | VanSlyke |
| 6,303,238 | B1 | 10/2001 | Thompson et al. |
| 6,476,265 | B1 | 11/2002 | Spreitzer et al. |
| 6,759,145 | B2 * | 7/2004 | Lin et al. ............ 428/690 |
| 7,009,338 | B2 * | 3/2006 | D'Andrade et al. ...... 313/504 |
| 7,071,614 | B2 * | 7/2006 | Anandan et al. ........ 313/504 |
| 2002/0028349 | A1 | 3/2002 | Seo |

(Continued)

FOREIGN PATENT DOCUMENTS

DE     103 30 761     2/2005

(Continued)

OTHER PUBLICATIONS

Baldo, M. A., et al., "Highly Efficient Phosphorescent Emission from Organic Electroluminescent Devices", Nature, 1998, vol. 395, pp. 151-154.

(Continued)

*Primary Examiner*—Nimeshkumar D Patel
*Assistant Examiner*—Natalie K Walford
(74) *Attorney, Agent, or Firm*—Connolly Bove Lodge & Hutz LLP

(57) ABSTRACT

The invention relates to the improvement of phosphorescing organic electroluminescent devices characterized in that the emission layer, which consists of a matrix material which is doped with at least one phosphorescing emitter, directly adjoins an electrically conducting layer.

23 Claims, 1 Drawing Sheet

U.S. PATENT DOCUMENTS

| | | |
|---|---|---|
| 2002/0034656 A1 | 3/2002 | Thompson et al. |
| 2003/0020073 A1* | 1/2003 | Long et al. .................... 257/79 |
| 2003/0022019 A1 | 1/2003 | Seo et al. |
| 2003/0068526 A1 | 4/2003 | Kamatani et al. |
| 2003/0096138 A1 | 5/2003 | Lecloux et al. |
| 2003/0146443 A1 | 8/2003 | Yamazaki et al. |
| 2004/0106006 A1 | 6/2004 | Eriyama et al. |
| 2004/0133004 A1 | 7/2004 | Stossel et al. |
| 2004/0138455 A1 | 7/2004 | Stossel et al. |
| 2005/0131232 A1 | 6/2005 | Stössel et al. |
| 2005/0176958 A1 | 8/2005 | Stössel et al. |
| 2005/0234240 A1 | 10/2005 | Stössel et al. |
| 2006/0065890 A1 | 3/2006 | Stossel et al. |

FOREIGN PATENT DOCUMENTS

| | | |
|---|---|---|
| DE | 103 45 572 | 5/2005 |
| DE | 103 55 380 | 6/2005 |
| DE | 103 55 358 | 7/2005 |
| EP | 1 191 612 | 3/2002 |
| EP | 1 191 613 | 3/2002 |
| EP | 1 191 614 | 3/2002 |
| JP | 2002033191 A | 1/2001 |
| JP | 2003123980 A | 4/2003 |
| JP | 2003257676 A | 9/2003 |
| JP | 2003264086 A | 9/2003 |
| JP | 2003317946 A | 11/2003 |
| WO | WO-98/01011 | 1/1998 |
| WO | WO-99/12888 | 3/1999 |
| WO | WO-00/70655 | 11/2000 |
| WO | WO-01/41512 | 6/2001 |
| WO | WO-02/02714 | 1/2002 |
| WO | WO-02/15645 | 2/2002 |
| WO | WO-02/068435 | 9/2002 |
| WO | WO-02/081488 | 10/2002 |
| WO | WO-03/001569 | 1/2003 |
| WO | WO-03/040160 | 5/2003 |
| WO | WO-03/040257 | 5/2003 |
| WO | WO-03/072681 | 9/2003 |
| WO | WO-03/084972 | 10/2003 |
| WO | WO-03/099959 | 12/2003 |
| WO | WO-2004/016709 | 2/2004 |
| WO | WO-2004/026886 | 4/2004 |
| WO | WO-2004/081017 | 9/2004 |
| WO | WO-2004/093207 | 10/2004 |

OTHER PUBLICATIONS

J. Salbeck et al., "Low molecular organic glasses for blue electroluminescence," *Synthetic Metals*, vol. 91, pp. 209-215 (1997).

S. Tokito et al., "High-efficiency phosphorescent polymer light-emitting devices," *Organic Electronics*, vol. 4, pp. 105-111 (2003).

H. Li et al., "Organic light-emitting devices based on aromatic polyimide doped by electrophosphorescent material *fac* tris(2-phenylpyridine) iridium," *Semicond. Sci. Technol*, vol. 18, pp. 278-283 (2003).

M. Cocchi et al., "Highly efficient organic electrophosphorescent light-emitting diodes with a reduced quantum efficiency roll of at large current densities," *Applied Physics Letters*, vol. 84, No. 7, pp. 1052-1054 (Feb. 16, 2004).

Martens H.C.F., et al., "Frequency dependent carrier mobility in polymer LED'S", Synthetic Metals 121, (2001), pp. 1643-1644.

Tang C.W., et al., "Organic electroluminescent diodes", American Institute of Physics, Sep. 21, 1987, pp. 913-915.

* cited by examiner

PHOSPHORESCENT ORGANIC ELECTROLUMINESCENT DEVICE HAVING NO HOLE TRANSPORTING LAYER

RELATED APPLICATIONS

This application is a national stage application (under 35 U.S.C. 371) of PCT/EP2004/013315 filed Nov. 24, 2004 which claims benefit to German application 103 55 381.9 filed Nov. 25, 2003, German application 10 2004 006 622.1 filed Feb. 10, 2004, and German application 10 2004 015 933.5 filed Apr. 1, 2004.

The present invention describes a novel design principle for organic electroluminescent elements and the use thereof in displays based thereon.

The use of organic semiconductors as functional materials has been reality for some time or is expected in the near future in a number of different applications which can be ascribed to the electronics industry in the broadest sense. The use of semiconducting organic compounds which are capable of the emission of light in the visible spectral region is just at the beginning of market introduction, for example in organic electroluminescent devices (OLEDs). For simple devices containing OLEDs, the market introduction has already taken place, as confirmed by the automobile radios from Pioneer, the mobile telephones from Pioneer and SNMD and a digital camera with an "organic display" from Kodak.

A development that has emerged in recent years is the use of organometallic complexes which exhibit phosphorescence instead of fluorescence (M. A. Baldo et al., *Appl. Phys. Lett.* 1999, 75, 4-6). For quantum-mechanical reasons, an up to four-fold quantum, energy and power efficiency is possible using organometallic compounds. The essential conditions that may be mentioned here for practical use of these phosphorescent emitters are, in particular, a long operating lifetime and a low use and operating voltage, together with high power efficiency, in order to facilitate mobile applications.

Significant advances have been achieved here in recent time. However, there are still considerable problems which require urgent improvement: thus, the construction of these OLEDs through the multiplicity of organic layers is complex and expensive; a reduction in the number of layers would be very important for production in order to reduce the number of production steps and thus to lower the costs and increase production reliability. Furthermore, the process window is frequently too small in the case of the previous device structure, i.e. relatively small variations in the degree of doping or the layer thickness result in large variations in the emission properties. It would be desirable here to have available a larger process window in order to increase production reliability.

This makes further improvements necessary in the production of OLEDs, in particular in the layer structure.

The general structure of organic electroluminescent devices based on low-molecular-weight compounds is described, for example, in U.S. Pat. Nos. 4,539,507 and 5,151,629. A device of this type usually consists of a plurality of layers applied one on top of the other by means of vacuum methods or printing techniques. For phosphorescent organic electroluminescent devices, these layers are in detail:

1. Outer plate=substrate (usually glass or plastic sheet).
2. Transparent anode (usually indium-tin oxide, ITO).
3. Hole-injection layer (HIL): for example based on copper phthalocyanine (CuPc) or conductive polymers, such as polyaniline (PANI) or polythiophene derivatives (such as PEDOT).
4. One or more hole-transport layers (HTL): usually based on triarylamine derivatives, for example 4,4',4''-tris(N-1-naphthyl-N-phenylamino)triphenylamine (NaphDATA) as the first layer and N,N'-di(naphth-1-yl)-N,N'-diphenylbenzidine (NPB) as the second layer.
5. One or more emission layers (EML): usually comprising matrix materials, such as, for example, 4,4'-bis(carbazol-9-yl)biphenyl (CBP), doped with phosphorescent dyes, for example tris(phenylpyridyl)iridium ($Ir(PPy)_3$).
6. Hole-blocking layer (HBL): usually comprising BCP (2,9-dimethyl-4,7-diphenyl-1,10-phenanthroline=bathocuproin) or bis(2-methyl-8-quinolinolato)(4-phenyl-phenolato)aluminium(III) (BAlq).
7. Electron-transport layer (ETL): usually based on aluminium tris-8-hydroxy-quinolinate ($AlQ_3$).
8. Electron-injection layer (EIL, also known as insulator layer=ISL): thin layer consisting of a material having a high dielectric constant, such as, for example, LiF, $Li_2O$, $BaF_2$, MgO, NaF.
9. Cathode: generally metals, metal combinations or metal alloys having a low work function, for example Ca, Ba, Cs, Mg, Al, In, Mg/Ag.

As can be seen, different functions are assigned to the individual layers in electroluminescent devices based on low-molecular-weight compounds. This structure of a phosphorescent OLED is thus very complex since many layers, which in turn consist of many different materials, have to be applied one after the other, which makes the production process for such OLEDs technically very complex.

To date, there have been a number of attempts to simplify the layer structure of phosphorescent OLEDs:

U.S. 2003/0146443 describes OLEDs in which the emission layer (EML) consists of a matrix material having electron-conducting properties which is doped with a phosphorescent emitter. The layer structure is simplified here since a separate electron-transport layer does not have to be used. However, a hole-transport layer is absolutely necessary in accordance with this application. However, these OLEDs do not achieve the same efficiency as OLEDs of conventional construction, i.e. using an HBL/ETL.

The unpublished applications DE 10355358.4 and DE 10355380.0 described for certain matrix materials that lower voltages and higher power efficiencies are obtained if a separate hole-blocking layer and/or electron-transport layer is not used. Improved electronic properties are thus accompanied by a significantly simplified device structure here. However, hole-transport layers based on triarylamines were also used in all examples here.

The omission of layers on the cathode side has thus already enabled the device structure to be simplified. For industrial application, however, it would be desirable to be able further to simplify the layer structure in the electroluminescent device without at the same time impairing the electronic properties in the device.

Surprisingly, it has now been found that a triplet device in which the emission layer is directly adjacent to the hole-injection layer or to the anode, i.e. to an electrically conductive layer, continues to exhibit very good electronic properties with at the same time a further simplified layer structure. This is a surprising result since it was to date always assumed in the art that one or more hole-transport layers between the emission layer and the hole-injection layer or anode are absolutely necessary for good functioning of a phosphorescent electroluminescent device. Thus, even the first patents on triplet devices (for example U.S. Pat. No. 6,303,238) used a hole-transport layer based on triarylamine derivatives, and the first publication of a triplet device (M. A. Baldo et al., *Nature* 1998, 395, 151) described a device structure in which copper phthalocyanine is used as hole-injection layer and NPB as hole-transport layer.

Figure 1:
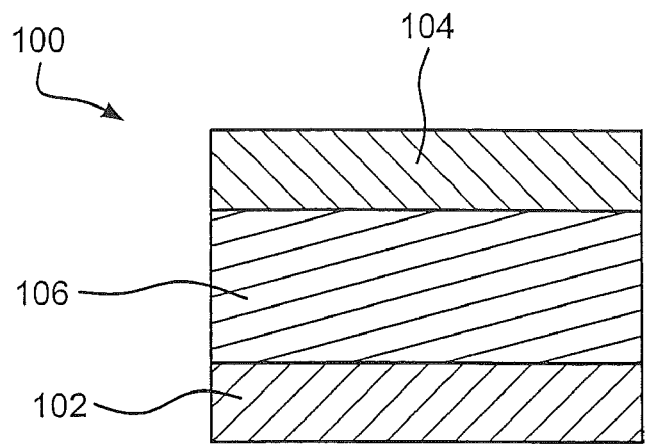
FIG. 1 depicts an organic electroluminescent device (100) having an anode or an electrically conductive layer (102), a cathode (104), and an emission layer (106).
Figure 2:
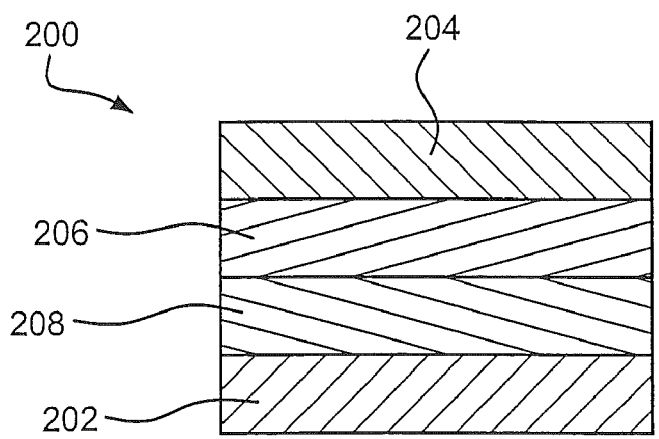
FIG. 2 depicts an organic electroluminescent device (200) having an anode (202), a cathode (204), an emission layer (206), and an electrically conductive layer (208).
Figure 3:
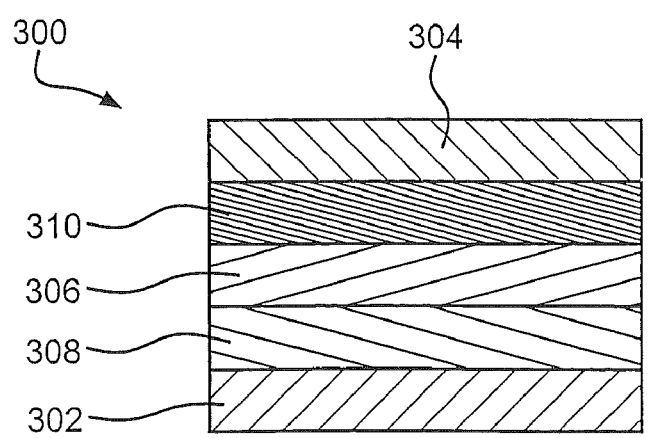
FIG. 3 depicts an organic electroluminescent device (300) having an anode (302), a cathode (304), an emission layer (306), an electrically conductive layer (308), and an electron transport layer (310).

The invention therefore relates to an organic electroluminescent device comprising an anode, a cathode and at least one emission layer comprising at least one matrix material which is doped with at least one phosphorescent emitter, characterised in that the emission layer on the anode side is directly adjacent to an electrically conductive layer.

In one aspect of the invention, the electrically conductive layer on the anode side is an organic or organometallic hole-injection layer between the anode and the emission layer.

In a further aspect of the invention, the electrically conductive layer is the anode itself.

For the purposes of this invention, a hole-injection layer should be taken to mean an organic or organometallic layer which is in direct contact with the anode and which comprises free charge carriers and is intrinsically electrically conductive. The hole-injection material, which can be low-molecular-weight, dendritic, oligomeric or polymeric, is thus an (organic) electrical conductor which exhibits ohmic behaviour in the ideal case, i.e. in which the current is proportional to the applied voltage. The hole-injection layer is generally made up of doped organic compounds; however, there are also other compounds which meet these requirements.

Since the delimitation between a hole-injection layer and a hole-transport layer is still not entirely clear, the following definitions, in particular, are intended to apply for the purposes of this invention: layers in direct contact with the anode whose electrical conductivity is greater than $10^{-8}$ S/cm, preferably between $10^{-7}$ and $10^{-1}$ S/cm, particularly preferably between $10^{-6}$ and $10^{-2}$ S/cm, are referred to as hole-injection layers for the purposes of this invention. The measurement of the conductivity in this conductivity range can be carried out here by two-point measurement on the film, where the ohmic resistance is measured and from which in turn, taking into account the layer thickness and the length, the specific resistance and the conductivity are determined (D. Meschede, Gerthsen, *Physik*, 21st Edition, 2001, page 319). Illustrative examples of these layers are doped conductive polymers, in particular doped polythiophene or polyaniline derivatives which are directly adjacent to the anode. Further examples of hole-injection layers are those which are built up from doped triarylamine derivatives, which can be low-molecular-weight, oligomeric, dendritic or polymeric, and are directly adjacent to the anode, where the doping of the triarylamine derivative can be carried out, for example, oxidatively by an oxidant and/or by an acid and/or Lewis acid. Layers which are built up from metal phthalocyanines, such as, for example, copper phthalocyanine (CuPc), and are directly adjacent to the anode are likewise referred to as hole-injection layer for the purposes of this invention (even though the mechanism of conductivity is not entirely clear here and possibly, without wishing to be tied to a particular theory, occurs through a high photoconductivity on operation of the OLED).

By contrast, a hole-transport layer should be taken to mean a layer which initially contains no free charge carriers and therefore does not exhibit electrical conductivity. Hole-transport materials are thus organic semiconductors which exhibit typical semiconductor or diode behaviour. These are generally built up from undoped organic compounds, usually from triarylamine derivatives, which may be low-molecular-weight, oligomeric, dendritic or polymeric, such as, for example, NaphDATA or NPB. The hole-transport layer is located either between the emission layer and the hole-injection layer or between the emission layer and the anode, where, on use of a plurality of layers which have these properties, all of these layers are referred to as hole-transport layers.

For the purposes of this application, this is not intended to encompass polymeric organic light-emitting diodes (PLEDs) since in the latter the polymer generally does a number of jobs itself, such as charge transport and emission, and therefore only one-layer or two-layer devices (which then additionally comprise an additional charge-injection layer) are generally produced here. For the purposes of this application, polymeric organic light-emitting diodes should be taken to mean organic light-emitting diodes in which the emission layer consists of a polymer, a mixture of a plurality of polymers or a mixture of one or more polymers with one or more low-molecular-weight compounds, where the polymer generally has a molecular weight $M_w$ of greater than 5000 g/mol, usually greater than 10,000 g/mol, and is characterised in that these are molecular-weight distributions.

A preferred embodiment of the invention thus relates to an organic electroluminescent device in which either the matrix material or the phosphorescent emitter is a low-molecular-weight defined compound having a molecular weight of less than 10,000 g/mol, preferably less than 5000 g/mol, particularly preferably less than 3000 g/mol. Particularly preferably, both the matrix material and the phosphorescent emitter are low-molecular-weight defined compounds having a molecular weight of less than 10,000 g/mol, preferably less than 5000 g/mol, particularly preferably less than 3000 g/mol.

The organic electroluminescent device may, in addition to the above-mentioned layers, also comprise further layers, such as, for example, one or more hole-blocking layers (HBL) and/or electron-transport layers (ETL) and/or electron-injection layers (EIL). However, it should be pointed out that the electroluminescent device also gives very good results in the absence of these layers and that it is thus preferred, owing to the simplified layer structure, for the electroluminescent device not to comprise these layers. In a preferred embodiment of the invention, the emission layer is directly adjacent to the electron-transport layer, i.e. the electroluminescent device according to the invention does not comprise a hole-blocking layer (HBL).

In a further preferred embodiment of the invention, the emission layer is directly adjacent to the cathode or the electron-injection layer, i.e. the electroluminescent device according to the invention does not comprise a hole-blocking layer (HBL) or an electron-transport layer (ETL).

It is also possible for more than one emission layer to be present. Two or more emission layers are particularly suitable for white-emitting electroluminescent devices. At least one of the emission layers here must be electrophosphorescent. Furthermore, the emission layers can be built up using the same or different matrix materials. Owing to the risk of contamination and for reasons of resource conservation, however, it has proven advantageous for the same matrix materials to be used in a plurality of or all emission layers.

Preference is given to an organic electroluminescent device which is characterised in that the layer thickness of the emission layer has a thickness of 1 to 300 nm, particularly preferably 5 to 200 nm, very particularly preferably 10 to 150 nm.

Preference is furthermore given to an organic electroluminescent device which is characterised in that the phosphorescent emitter present is a compound which has at least one atom having an atomic number of greater than 36 and less than 84. Particular preference is given to an organic electroluminescent device which is characterised in that the phosphorescent emitter comprises at least one element having an atomic number of greater than 56 and less than 80, very particularly preferably molybdenum, tungsten, rhenium, ruthenium, osmium, rhodium, iridium, palladium, platinum, silver, gold or europium, very particularly preferably iridium or platinum, for example in accordance with the patent applications WO 98/01011, US 02/0034656, US 03/0022019, WO 00/70655, WO 01/41512, WO 02/02714, WO 02/15645, EP 1191613, EP 1191612, EP 1191614, WO 03/040257, WO 03/084972, WO 03/099959, WO 03/040160, WO 02/081488, WO 02/068435, WO 04/026886, WO 04/081017 and DE 10345572.8. These are considered to be part of the application by way of reference.

The degree of doping of the phosphorescent emitter in the matrix is 0.5 to 50%, preferably 1 to 40%, particularly preferably 3 to 30%, very particularly preferably 5 to 25%. Surprisingly, it has been found here that relatively small variations in the degree of doping have no effect on the electrical and optical properties.

Preference is given to an organic electroluminescent device which is characterised in that the glass transition temperature $T_g$ of the matrix material is greater than 100° C., particularly preferably greater than 120° C., very particularly preferably greater than 140° C. In order that the materials are stable during sublimation and during the vapour-deposition process, they preferably have high thermal stability, preferably greater than 200° C., particularly preferably greater than 300° C., very particularly preferably greater than 350° C.

Preference is given to an organic electroluminescent device which is characterised in that the matrix material has an absorbance of less than 0.2, preferably less than 0.1, particularly preferably less than 0.05, in the visible spectral region between 380 nm and 750 nm at a film thickness of 30 nm.

The lowest triplet energy of the matrix materials is preferably between 2 and 4 eV. The lowest triplet energy here is defined as the energy difference between the singlet ground state and the lowest triplet state of the molecule. The triplet energy can be determined by spectroscopic methods or by quantum-chemical calculation. This triplet position has proven favourable since the energy transfer from the matrix material to the triplet emitter can then proceed very efficiently and thus result in high efficiency of the emission from the triplet emitter. Preference is given to matrix materials whose triplet energy is greater than the triplet energy of the triplet emitter used. The triplet energy of the matrix material is preferably at least 0.1 eV greater than that of the triplet emitter, in particular at least 0.5 eV greater than that of the triplet emitter.

The matrix material and the phosphorescent emitter are preferably uncharged compounds. These are preferred to salts since they can generally be evaporated more easily or at lower temperature than charged compounds, which form ionic crystal lattices. In addition, salts have a greater tendency towards crystallisation, which counters the formation of glass-like phases. Furthermore, the matrix material and the phosphorescent emitter are preferably defined molecular compounds.

Surprisingly, it has been found that, in particular, the use of electron-conducting matrix materials without a separate hole-transport layer shows good results. The matrix material is therefore preferably an electron-conducting compound, i.e. a compound which can easily be reduced.

Particular preference is given to matrix materials which are predominantly stable on reduction, i.e. exhibit predominantly reversible reduction or form predominantly stable free-radical anions. "Stable" and "reversible" here mean that the materials exhibit little or no decomposition or chemical reactions, such as rearrangements, on reduction. This can be checked, for example, by solution electrochemistry, in particular cyclic voltammetry.

The phosphorescent emitter preferably has a higher (less negative) HOMO (highest occupied molecular orbital) than the matrix material and is thus principally responsible for the hole current in the OLED. It is preferred here for the HOMO of the phosphorescent emitter to be in the region of ±0.5 eV compared with the HOMO of the hole-injection layer or anode (depending on whether a hole-injection layer is present or not). The matrix material preferably has a lower (more negative) LUMO (lowest unoccupied molecular orbital) than the phosphorescent emitter and is thus principally responsible for the electron current in the OLED. It is preferred here for the LUMO of the matrix material to be in the region of ±0.5 eV compared with the LUMO of the hole-blocking layer or electron-transport layer or the work function of the cathode (depending on which of these layers is directly adjacent to the emission layer).

The position of the HOMO or LUMO can be determined experimentally by various methods, for example by solution electrochemistry, for example cyclic voltammetry, or by UV photoelectron spectroscopy. In addition, the position of the LUMO can be calculated from the electrochemically determined HOMO and the band separation determined optically by absorption spectroscopy. Quantum-chemical calculation of the HOMO and LUMO positions is also possible.

The electron mobility of the matrix material is preferably between $10^{-10}$ and 1 cm$^2$/V·s, particularly preferably between $10^{-8}$ and $10^{-1}$ cm$^2$/V·s, very particularly preferably between $10^{-6}$ and $10^{-2}$ cm$^2$/V·s, under the field strengths of $10^4$ to $10^6$ V/cm given in the OLED. The electron mobility can be determined here, for example, by TOF (time of flight) measurements (L. B. Schein, A. Rosenberg, S. L. Rice, *J. Appl. Phys.* 1986, 60, 4287; J. X. Mack, L. B. Schein, A. Peled, *Phys. Rev. B* 1989, 39, 7500; A. R. Melnyk, D. M. Pai: *Physical Methods of Chemistry*, Vol. 8, Eds. B. W. Rossiter, R. C. Baetzold, Wiley, New York, 1993; 2nd Ed.).

Preferred suitable matrix materials which can be employed without a hole-transport layer and, where appropriate, without a hole-injection layer and give good results are ketones, imines, phosphine oxides, phosphine sulfides, phosphine selenides, phosphazenes, sulfones and sulfoxides of the formulae (1) to (4)

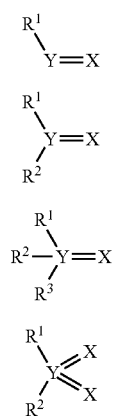

where the symbols used have the following meaning:

Y is equal to C in formula (2) and P, As, Sb or Bi in formulae (1) and (3) and S, Se or Te in formulae (1), (2) and (4);

X is on each occurrence, identically or differently, $NR^4$, O, S, Se or Te;

$R^1$, $R^2$, $R^3$ is on each occurrence, identically or differently, H, F, CN, $N(R^4)_2$, a straight-chain, branched or cyclic alkyl, alkoxy or thioalkoxy group having 1 to 40 C atoms, which may be substituted by R or also unsubstituted, where one or more non-adjacent $CH_2$ groups may be replaced by —$R^6C$=$CR^6$—, —C≡C—, $Si(R^6)_2$, $Ge(R^6)_2$, $Sn(R^6)_2$, C=O, C=S, C=Se, C=$NR^6$, —O—, —S—, —$NR^6$— or —$CONR^6$— and where one or more H atoms may be replaced by F, Cl, Br, I, CN or $NO_2$, or an aromatic or heteroaromatic ring system or an aryloxy or heteroaryloxy group having 1 to 40 aromatic C atoms, which may be substituted by one or more radicals $R^5$, where a plurality of substituents $R^1$, $R^2$ and/or $R^3$ may form a mono- or polycyclic, aliphatic or aromatic ring system with one another;

$R^4$ is on each occurrence, identically or differently, a straight-chain, branched or cyclic alkyl or alkoxy chain having 1 to 22 C atoms, in which, in addition, one or more non-adjacent C atoms may be replaced by —$R^6C$=$CR^6$—, —C≡C—, $Si(R^6)_2$, $Ge(R^6)_2$, $Sn(R^6)_2$, —$NR^6$—, —O—, —S—, —CO—O— or —O—CO—O—, and where one or more H atoms may be replaced by fluorine, an aryl, heteroaryl or aryloxy group having 1 to 40 C atoms, which may also be substituted by one or more radicals $R^6$, or OH or $N(R^5)_2$;

$R^5$ is on each occurrence, identically or differently, $R^4$ or CN, $B(R^6)_2$ or $Si(R^6)_3$;

$R^6$ is on each occurrence, identically or differently, H or an aliphatic or aromatic hydrocarbon radical having 1 to 20 C atoms;

with the proviso that the molecular weight is at least 150 g/mol.

For the purposes of this invention, an aromatic or heteroaromatic ring system should be taken to mean a system which does not necessarily comprise only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, $sp^3$-hybridised C, O, N, etc. Thus, for example, systems such as 9,9'-spirobifluorene, 9,9-diarylfluorene, triarylamine, diphenyl ether, etc., should thus also be regarded as aromatic systems.

Ketones and imines as matrix materials are described, for example, in the unpublished patent application WO 04/093207. Phosphines, phosphine sulfides, phosphine selenides, phosphazenes, sulfones and sulfoxides as matrix materials are described, for example, in the unpublished patent application DE 10330761.3.

Preferred substituents $R^1$ to $R^3$ are aromatic or heteroaromatic ring systems; preferred substituents $R^1$ to $R^3$ and preferred structures are revealed by the above-mentioned applications. Particular preference is given to ketones, phosphine oxides and sulfoxides; very particular preference is given to ketones.

Preference is furthermore given to an organic electroluminescent device which is characterised in that one or more layers are coated by a sublimation process. The low-molecular-weight materials here are vapour-deposited in vacuum sublimation units at a pressure of less than $10^{-5}$ mbar, preferably less than $10^{-6}$ mbar, particularly preferably less than $10^{-7}$ mbar.

Preference is likewise given to an organic electroluminescent device which is characterised in that one or more layers are coated by the OVPD (organic vapour phase deposition) process or with the aid of carrier-gas sublimation. The low-molecular-weight materials here are applied in an inert carrier gas at a pressure of between $10^{-5}$ mbar and 1 bar.

Preference is furthermore given to an organic electroluminescent device which is characterised in that one or more layers are coated by the LITI (light induced thermal imaging, thermal transfer printing) process.

The emitting devices described above have the following surprising advantages over the prior art:

1. The efficiency of corresponding devices is comparable or higher than in systems comprising separate hole-transport layers. This is a surprising result since it was to date always assumed that the use of one or more hole-transport layers is absolutely necessary for good functioning of the electroluminescent device.

2. The operating voltages are comparable with electroluminescent devices which comprise a separate hole-transport layer.

3. The layer structure is simpler since at least one organic layer less is used than in electroluminescent devices in accordance with the prior art. A particularly clear advantage arises if the emission layer is not only directly adjacent to the hole-injection layer or the anode, but is also directly adjacent to the cathode, since then the entire electroluminescent device consists only of one or two organic layers (emission layer and optionally hole-injection layer). The production complexity thus becomes significantly lower. This is a considerable advantage in the production process, since a separate vapour-deposition unit is generally used for each organic layer in the conventional production procedure, enabling at least one such unit to be saved or omitted entirely. This conserves resources and reduces the risk of contamination, increasing the yield.

4. The emission spectrum is identical to the emission spectrum obtained using a comparable electroluminescent device which comprises a hole-transport layer. In particular, it is noted that the emission properties, for example the emission colour, are independent of the degree of doping over a broad range. This is a clear advantage in production, since the process window is thus broadened and relatively small deviations in the production conditions do not result in deviations in the product properties. Production reliability is thus increased.

5. The device properties, such as emission colour and voltage, are likewise relatively independent of the layer thickness of the emission layer. This is likewise a significant advantage in production, since the process window is thus broadened and relatively small deviations in the production conditions do not result in deviations in the product properties. Production reliability is thus increased.

6. The lifetime of corresponding devices is comparable with systems which comprise separate hole-transport layers.

Details on the information given here are given in the examples described below.

The present application text and also the further examples below only relate to organic light-emitting diodes and the corresponding displays. In spite of this restriction of the description, it is possible for the person skilled in the art, without further inventive step, also to use the corresponding design according to the invention for other, related devices, for example for organic solar cells (O-SCs), organic laser diodes (O-lasers) or also photorefractive components, to mention but a few further applications.

EXAMPLES

Production and Characterisation of Organic Electroluminescent Devices:

Electroluminescent devices according to the invention can be produced as described, for example, in patent application DE10330761.3. This process has been adapted in individual cases to the respective circumstances (for example layer-thickness variation). For the production of the devices according to the invention, a separate hole-transport layer was not used, nor was an electron-transport layer or hole-blocking layer.

In the following examples, the results for various OLEDs are presented. The basic structure, such as the materials and layer thicknesses used, were identical for better comparability.

Emitting OLEDs having the following structure were produced analogously to the above-mentioned general process:

PEDOT (HIL) 60 nm (spin-coated from water; PEDOT purchased from H. C. Starck; poly[3,4-ethylenedioxy-2,5-thiophene] with poly(styrenesulfonic acid))

Emission layer: precise structure: see examples in Table 1

Ba/Al (cathode) 3 nm Ba, 150 nm Al on top

A separate hole-blocking layer and a separate electron-transport layer were not used in any of the examples.

In addition, electroluminescent devices which comprised a hole-transport layer in accordance with the prior art with the following structure between the emission layer and the hole-injection layer were produced for comparison:

NaphDATA (HTM) 20 nm (vapour-deposited; NaphDATA purchased from SynTec; 4,4',4''-tris(N-1-naphthyl-N-phenylamino)triphenyl-amine S-TAD (HTM) 20 nm (vapour-deposited; S-TAD prepared in accordance with WO 99/12888; 2,2',7,7'-tetrakis(diphenylamino)spiro-bifluorene)

These still unoptimised OLEDs were characterised by standard methods; the electroluminescence spectra, the maximum efficiency (measured in cd/A) and the maximum power efficiency (measured in lm/W) as a function of the brightness, calculated from current/voltage/brightness characteristic lines (IUL characteristic lines), were determined for this purpose.

Table 1 shows the results of various examples. The composition of the emission layer including the layer thicknesses is shown. The doped phosphorescent emission layers comprise the compound bis(9,9'-spirobifluoren-9-yl) ketone (synthesised in accordance with WO 04/093207) as matrix material M1. The lifetimes of the various device arrangements are comparable. Ir(piq)$_3$ was synthesised in accordance with U.S. 2003/0068526. Ir-1 was synthesised in accordance with the unpublished application DE 10345572.8.

The abbreviations used in Table 1 correspond to the following compounds:

TABLE 1

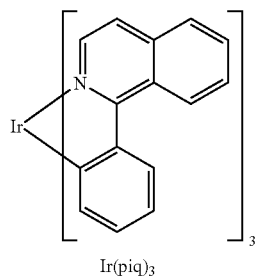

Ir(piq)₃

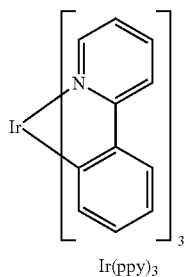

Ir(ppy)₃

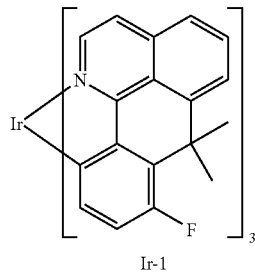

Ir-1

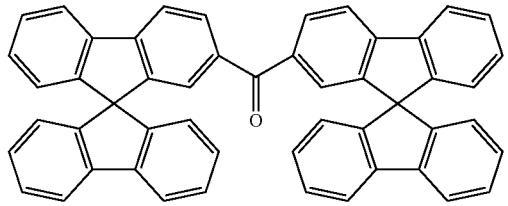

Matrix material M1

| Experiment | HIL | HTL1 | HTL2 | EML | Max. efficiency (cd/A) | Max. power efficiency (lm/W) | Voltage (V) at 100 cd/m² |
|---|---|---|---|---|---|---|---|
| Example 1 a) | PEDOT (60 nm) | — | — | M1: Ir(piq)₃ (20%) (100 nm) | 7.3 | 8.2 | 3.5 |
| Example 1 b) (comparison) | PEDOT (60 nm) | NaphDATA (20 nm) | S-TAD (20 nm) | M1: Ir(piq)₃ (20%) (60 nm) | 7.0 | 8.1 | 3.2 |
| Example 1 c) (comparison) | PEDOT (60 nm) | — | S-TAD (20 nm) | M1: Ir(piq)₃ (20%) (80 nm) | 5.8 | 5.1 | 4.0 |
| Example 2 a) | PEDOT (60 nm) | — | — | M1: Ir(ppy)₃ (20%) (80 nm) | 40.1 | 50.4 | 3.0 |
| Example 2 b) (comparison) | PEDOT (60 nm) | NaphDATA (20 nm) | S-TAD (20 nm) | M1: Ir(ppy)₃ (20%) (60 nm) | 35.3 | 49.8 | 3.0 |
| Example 3 a) | PEDOT (60 nm) | — | — | M1: Ir-1 (10%) (60 nm) | 14.8 | 11.4 | 3.8 |
| Example 3 b) (comparison) | PEDOT (60 nm) | NaphDATA (20 nm) | S-TAD (20 nm) | M1: Ir-1 (10%) (60 nm) | 14.9 | 11.0 | 4.0 |

In summary, it can be stated that OLEDs produced in accordance with the novel design principle have comparable or higher efficiency with comparable voltages and a comparable lifetime, as can easily be seen from Table 1, with the structure of the OLED having been considerably simplified.

The invention claimed is:

1. Organic electroluminescent device comprising an anode, a cathode and at least one emission layer comprising at least one matrix material which is doped with at least one phosphorescent emitter, characterised in that the emission layer on the anode side is directly adjacent to an electrically conductive layer, wherein both said at least one matrix material and said at least one phosphorescent emitter are low-molecular-weight defined compounds having a molecular weight of less than 10,000 g/mol, and wherein said electrically conductive layer is said anode or an organic hole-injection layer comprising a doped conductive polymer or a doped triarylamine derivative.

2. Organic electroluminescent device according to claim 1, characterised in that it comprises further layers.

3. Organic electroluminescent device according to claim 2, characterised in that the further layers are one or more hole-blocking layers and/or electron-transport layers and/or electron-injection layers.

4. Organic electroluminescent device according to claim 1, characterised in that the emission layer is directly adjacent to the electron-transport layer without the use of a hole-blocking layer.

5. Organic electroluminescent device according to claim 1, characterised in that the emission layer is directly adjacent to the cathode or the electron-injection layer without the use of a hole-blocking layer and without the use of an electron-transport layer.

6. Organic electroluminescent device according to claim 1, characterised in that more than one emission layer is present.

7. Organic electroluminescent device according to claim 1, characterised in that the emission layer has a layer thickness of 1 to 300 nm.

8. Organic electroluminescent device according to claim 1, characterised in that the phosphorescent emitter present is a compound which contains at least one atom having an atomic number of greater than 36 and less than 84.

9. Organic electroluminescent device according to claim 8, characterised in that the phosphorescent emitter comprises at least one element selected from molybdenum, tungsten, rhenium, ruthenium, osmium, rhodium, iridium, palladium, platinum, silver, gold or europium.

10. Organic electroluminescent device according to claim 1, characterised in that the degree of doping of the phosphorescent emitter in the matrix is 0.5 to 50%.

11. Organic electroluminescent device according to claim 1, characterised in that the glass transition temperature $T_g$ of the matrix material is greater than 100° C.

12. Organic electroluminescent device according to claim 1, characterised in that the matrix material has an absorbance of less than 0.2 in the visible spectral region between 380 nm and 750 nm at a film thickness of 30 nm.

13. Organic electroluminescent device according to claim 1, characterised in that the lowest triplet energy of the matrix material is between 2 and 4 eV.

14. Organic electroluminescent device according to claim 1, characterised in that the matrix material is an electron-conducting compound.

15. Organic electroluminescent device according to claim 14, characterised in that the matrix material exhibits predominantly reversible reduction or forms predominantly stable free-radical anions.

16. Organic electroluminescent device according to claim 1, characterised in that the electron mobility of the matrix material is between $10^{-10}$ and 1 cm²/V·s.

17. Organic electroluminescent device according to claim 1, characterised in that the matrix material is ketone, imine, phosphine oxide, phosphine sulfide, phosphine selenide, phosphazene, sulfone or sulfoxide.

18. Organic electroluminescent device according to claim 17, characterised in that the matrix materials is ketone phosphine oxide or sulfoxide.

19. Organic electroluminescent device according to claim 1, characterised in that one or more layers are coated by a sublimation process.

20. Organic electroluminescent device according to claim 1, characterised in that one or more layers are coated by the organic vapour phase deposition (OVPD) process or with the aid of carrier-gas sublimation.

21. Organic electroluminescent device according to claim 1, characterised in that one or more layers are coated by the LITI (light induced thermal imaging) process.

22. Organic solar cell which comprises the organic electroluminescent device as claimed in claim 1.

23. Organic laser diode which comprises the organic electroluminescent device as claimed in claim 1.

* * * * *